United States Patent
Omori (10) Patent No.: US 10,332,767 B2
(45) Date of Patent: Jun. 25, 2019

(54) SUBSTRATE TRANSPORT DEVICE AND SUBSTRATE PROCESSING APPARATUS

(71) Applicant: ASM IP Holding B.V., Almere (NL)

(72) Inventor: Taku Omori, Akiruno (JP)

(73) Assignee: ASM IP Holding B.V., Almere (NL)

( * ) Notice: Subject to any disclaimer, the term of this patent is extended or adjusted under 35 U.S.C. 154(b) by 401 days.

(21) Appl. No.: 14/973,359

(22) Filed: Dec. 17, 2015

(65) Prior Publication Data
US 2017/0178939 A1 Jun. 22, 2017

(51) Int. Cl.
| | |
|---|---|
| H01L 21/67 | (2006.01) |
| H01L 21/677 | (2006.01) |
| H01L 21/68 | (2006.01) |
| H01L 21/687 | (2006.01) |

(52) U.S. Cl.
CPC .... *H01L 21/67742* (2013.01); *H01L 21/6719* (2013.01); *H01L 21/68764* (2013.01); *H01L 21/68771* (2013.01); *H01L 21/68785* (2013.01)

(58) Field of Classification Search
CPC ........... H01L 21/67742; H01L 21/6719; H01L 21/68771; H01L 21/68785; H01L 21/68764
See application file for complete search history.

(56) References Cited

U.S. PATENT DOCUMENTS

| | | | | |
|---|---|---|---|---|
| 6,089,630 A | * | 7/2000 | Watanabe | H01L 21/67103 |
| | | | | 294/213 |
| 6,267,423 B1 | * | 7/2001 | Marohl | H01L 21/68707 |
| | | | | 294/213 |
| 2009/0196724 A1 | * | 8/2009 | Chen | H01L 21/68707 |
| | | | | 414/590 |
| 2009/0324828 A1 | | 12/2009 | Kato et al. | |
| 2010/0199797 A1 | * | 8/2010 | Sueyoshi | B25J 9/042 |
| | | | | 74/490.05 |
| 2011/0049921 A1 | * | 3/2011 | Fujii | H01L 21/67742 |
| | | | | 294/86.4 |

\* cited by examiner

*Primary Examiner* — Saul Rodriguez
*Assistant Examiner* — Ashley K Romano
(74) *Attorney, Agent, or Firm* — Studebaker & Brackett PC (57) ABSTRACT

A substrate transport device includes a shaft, a first moving part for moving the shaft in a vertical direction and in a rotational direction, at least one rotation arm attached to the shaft, and a supporting part having an upper surface waved as seen front view, wherein the rotation arm includes a contact rotation arm which directly or indirectly contacts the upper surface of the supporting part.

17 Claims, 8 Drawing Sheets

SUBSTRATE TRANSPORT DEVICE AND SUBSTRATE PROCESSING APPARATUS

BACKGROUND OF THE INVENTION

Field of the Invention

The present invention relates to a substrate transport device used to transport substrates, and to a substrate processing apparatus.

Background Art

US2009/324828 discloses a film forming apparatus and technique in which at least two reactive gases are supplied one after another to a surface of a substrate; the cycle of supplying the reactive gases is executed a number of times; and a multiplicity of layers of a reaction product are thereby laid one on another to form a thin film. In the art disclosed in US2009/324828, a transport arm is used to move wafers.

In a case where a substrate is transported by being put on an arm, care should be taken that the substrate does not move by sliding on the arm. In a case where a substrate is transported while an arm on which the substrate is put is being rotated, however, there is a possibility of the substrate being moved on the arm by centrifugal force acting on the substrate. If the speed of rotation of the arm is increased in order to improve the substrate transport throughput, the possibility of the substrate moving on the arm is increased.

If the arm has a fixed first end and a free second end, a peripheral portion of the arm at the second end is bent downward by the weight thereof. There is a possibility of the substrate sliding easily on the arm due to this bending.

SUMMARY OF THE INVENTION

In view of the above-described problem, an object of the present invention is to provide a substrate transport device and a substrate processing apparatus capable of preventing a substrate from moving on an arm during transport of the substrate.

The features and advantages of the present invention may be summarized as follows.

According to one aspect of the present invention, a substrate transport device includes a shaft, a first moving part for moving the shaft in a vertical direction and in a rotational direction, at least one rotation arm attached to the shaft, and a supporting part having an upper surface waved as seen front view, wherein the rotation arm includes a contact rotation arm which directly or indirectly contacts the upper surface of the supporting part.

According to another aspect of the present invention, a substrate processing apparatus includes a substrate transport device having a shaft, a first moving part for moving the shaft in a vertical direction and in a rotational direction, at least one rotation arm attached to the shaft, and a supporting part having an upper surface waved as seen front view, wherein the rotation arm includes a contact rotation arm which directly or indirectly contacts the upper surface of the supporting part, and a plurality of process regions, wherein the substrate transport device moves a substrate between the plurality of process regions.

Other and further objects, features and advantages of the invention will appear more fully from the following description.

DETAILED DESCRIPTION OF THE PREFERRED EMBODIMENTS

A substrate transport device and a substrate processing apparatus according to an embodiment of the present invention will be described with reference to the drawings. Components identical or corresponding to each other are indicated by the same reference characters and repeated description of them is avoided in some cases.

First Embodiment

Figure 1:
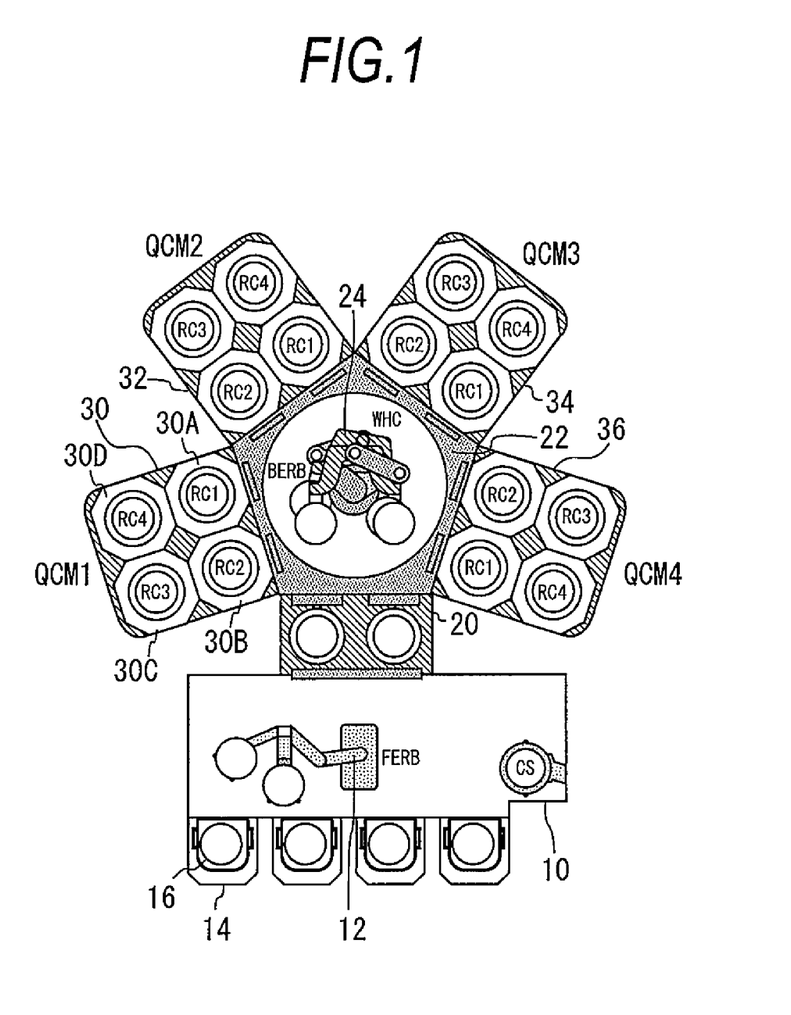
FIG. 1 is a plan view of a substrate processing apparatus including a substrate transport device according to a first embodiment.

FIG. 1 is a plan view of a substrate processing apparatus including a substrate transport device according to a first embodiment of the present invention. This substrate processing apparatus is provided with a transport chamber 10. The interior of the transport chamber 10 is maintained generally at atmospheric pressure. The transport chamber is called an equipment front end module (EFEM).

A robot arm 12 for transporting substrates is provided in the transport chamber 10. This robot arm 12 is called a Front End Robot (FERB). The robot arm 12 includes, for example, an upper arm and a lower arm and is, therefore, capable of transporting two substrates separately.

A load port 14 is attached to a side of the transport chamber 10. The load port 14 is a table on which a case 16 (FOUP) containing substrates is mounted. The robot arm 12 draws out a substrate from the case 16 or puts a substrate in the case 16.

A load lock chamber 20 is attached to another side of the transport chamber 10. A vacuum chamber 22 is attached to the load lock chamber 20. The vacuum chamber 22 is called a wafer handling chamber (WHC). A robot arm 24 is provided in the vacuum chamber 22. The robot arm 24 provided in the vacuum chamber 22 is called a back end robot (BERB).

A gate valve is provided between the transport chamber 10 and the load lock chamber 20. A gate valve is also provided between the load lock chamber 20 and the vacuum chamber 22. The load lock chamber 20 is provided for the purpose of maintaining a vacuum in the vacuum chamber 22 by not opening the vacuum chamber 22 to the atmosphere.

The periphery of the vacuum chamber 22 is in pentagonal form as viewed in plan. The load lock chamber 20 is connected to one side of the vacuum chamber 22. Quad chamber modules (QCMs) 30, 32, 34, and 36 are connected to the other four sides of the vacuum chamber 22. The QCMs are modules respectively having four reactor chambers 30A, 30B, 30C, and 30D (RC1 to RC4). Processing such as plasma film forming processing is performed on substrates in each reactor chamber. One side of each QCM faces the vacuum chamber 22. RC1 and RC2 adjoin the vacuum chamber 22. The RC3 and RC4 adjoin the vacuum chamber 22 through the RC1 and RC2.

The robot arm 24 supplies substrates to the RC1 and RC2 or draws out substrates from the RC1 and RC2. When substrates are supplied to the RC3 and RC4, the substrates are supplied from the robot arm 24 into the RC1 and RC2 and thereafter moved into the RC3 and RC4 by the substrate transport device provided in the QCM 30. When substrates are drawn out from the RC3 and RC4, the substrates are moved from the RC3 and RC4 into the RC1 and RC2 by the substrate transport device provided in the QCM 30 and are thereafter drawn out by the robot arm 24. Each of the QCMs 32, 34, and 36 is constructed in the same way as that of the QCM 30 and the same description of their construction will not be repeated.

Figure 2:
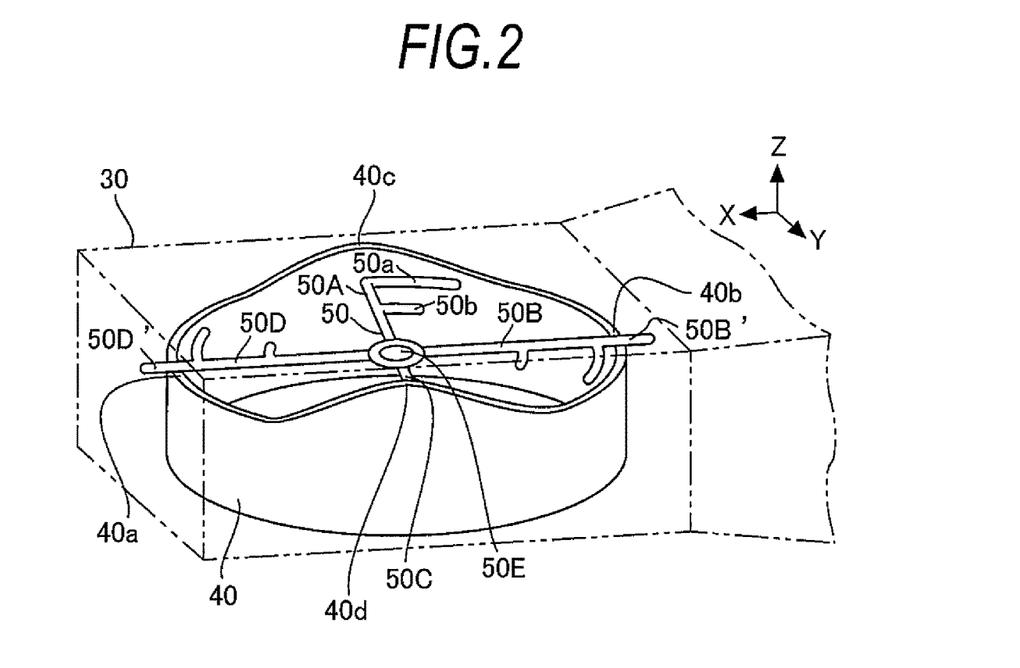
FIG. 2 is a perspective view of the substrate transport device.

FIG. 2 is a perspective view of the substrate transport device in the QCM 30. The QCM 30 includes a cylindrical supporting part 40 having a cylindrical shape. The cylindrical supporting part 40 is provided on a bottom surface of the QCM 30. The cylindrical supporting part 40 has an upper surface waved as seen in a front view. That is, the upper surface of the cylindrical supporting part 40 has a slope along its periphery. Accordingly, the cylindrical supporting part 40 has, in its upper surface, first upper surfaces 40a and 40b including portions lowest in height, and second upper surfaces 40c and 40d including portions highest in height.

A rotatable member 50 for transporting substrates is provided in the QCM 30. The rotatable member 50 has four rotation arms 50A, 50B, 50C, and 50D. The rotation arms 50A, 50B, 50C, and 50D are rotated while supporting substrates, thereby transporting a substrate. The rotation arms 50A, 50B, 50C, and 50D are formed, for example, of a ceramic.

The rotating member 50 has a shaft 50E. First ends of the rotation arms 50A, 50B, 50C, and 50D are attached to the shaft 50E. The shaft 50E is a rod extending along a Z-axis direction. The rotation arms 50A, 50B, 50C, and 50D are radially attached to the shaft 50E. Each of the angle formed between the rotation arms 50A and 50B, the angle formed between the rotation arms 50B and 50C, the angle formed between the rotation arms 50C and 50D and the angle formed between the rotation arms 50D and 50A is 90°.

Fins 50a and 50b are provided on each of the rotation arms 50A, 50B, 50C, and 50D. The fins 50a and 50b are used to support a substrate. The rotation arms 50B and 50D are longer than the rotation arms 50A and 50C. Extensions 50B' and 50D' extending from the rotation arms 50B and 50D in such directions as to be distanced away from the shaft 50E are provided on the rotation arms 50B and 50D, while no such extensions are provided on the rotation arms 50A and 50C. Accordingly, the rotation arms 50B and 50D are put on the first upper surfaces 40b and 40a, respectively, while the rotation arms 50A and 50C do not contact the cylindrical supporting part 40.

The rotation arms 50B and 50D formed longer than the other rotation arms to contact the upper surface of the cylindrical supporting part 40 will be referred to particularly as "contact rotation arms" in some places below. The contact rotation arms directly or indirectly contact the upper surface of the cylindrical supporting part 40. FIG. 2 shows a state where the rotation arms 50B and 50D, i.e., the contact rotation arms, are in direct contact with the upper surface of the cylindrical supporting part 40. On the other hand, the rotation arms 50A and 50C which are shorter than the contact rotation arms and which do not contact the cylindrical supporting part 40 will be referred to as "non-contact rotation arms" in some places below.

Figure 3:
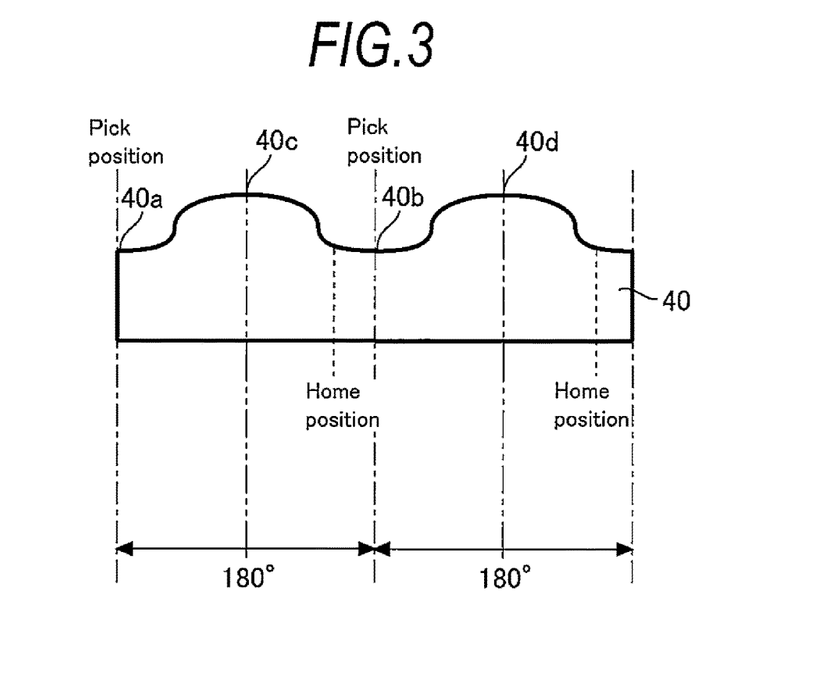
FIG. 3 is a development of the cylindrical supporting part.

FIG. 3 is a development of the cylindrical supporting part 40. A position on the upper surface of the cylindrical supporting part lowest in height will be referred to as a pick position. Pick positions exist on the first surfaces 40a and 40b. At the pick positions, substrates are caught by or released from the rotation arms 50A, 50B, 50C, and 50D. When the rotation arms 50B and 50D, i.e., the contact rotation arms, are at the pick positions, all the rotation arms are substantially horizontal.

Positions on the upper surface of the cylindrical supporting part 40 at small distances from the pick positions are referred to as home positions. The rotation arms stand by at the home positions. When the contact rotation arms are at the home positions, all the rotation arms are generally horizontal but have some inclinations.

Figure 4:
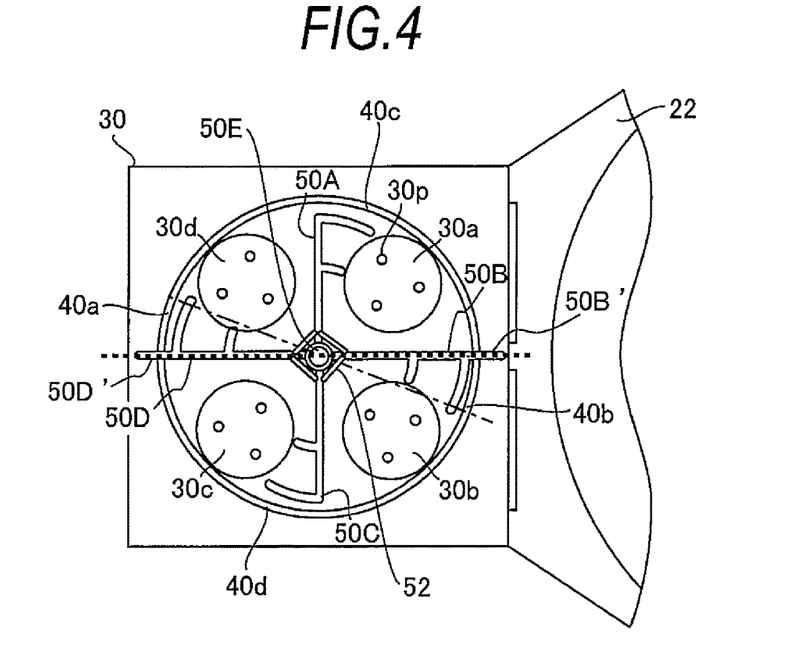
FIG. 4 is a plan view of the substrate transport device.

FIG. 4 is a plan view of the substrate transport device. The pick positions are indicated by a dot-dash line, while the home positions are indicated by a broken line. Four susceptors 30a, 30b, 30c, and 30d are provided in the cylindrical supporting part 40. The shaft 50E is at a position surrounded by the plurality of susceptors 30a, 30b, 30c, and 30d. On the susceptors 30a, 30b, 30c, and 30d, susceptor pins 30p caused to project from the surfaces of the susceptors or retracted in the susceptors are mounted. For example, three susceptor pins 30p are provided on each susceptor.

The plurality of rotation arms 50A, 50B, 50C, and 50D are connected to each other by a sync unit 52. When the angle of inclination of one of the rotation arms is increased, the sync unit 52 increases the angles of inclination of other rotation arms. When the angle of inclination of one of the rotation arms is reduced, the sync unit 52 reduces the angles of inclination of other rotation arms. All the rotation arms are thereby generally made uniform in angle of inclination.

FIG. 4 shows a state where the rotation arms 50B and 50D are at the home positions (on the broken line). When the rotation arms 50B and 50D are at the home positions, the positions of all the rotation arms 50A, 50B, 50C, and 50D are such that the rotation arms 50A, 50B, 50C, and 50D do not overlap the susceptors 30a, 30b, 30c, and 30d, as viewed in plan. It should be noted that rotation arms 50A, 50B, 50C, and 50D and cylindrical supporting part 40 may be rotated in 90° in a plan view.

Figure 5:
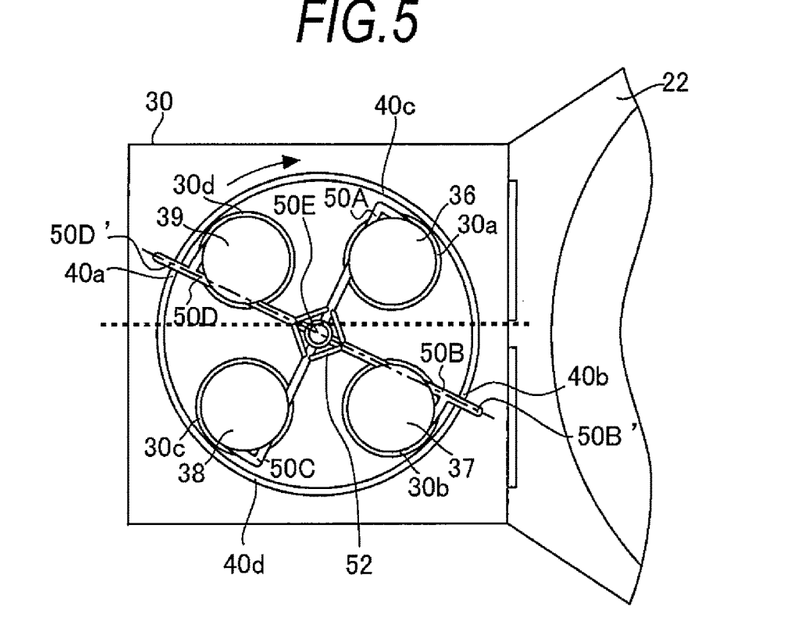
FIG. 5 is a plan view of the substrate transport device.

A method of transporting substrates according to the first embodiment of the present invention will be described. FIG. 5 is a plan view of internal portions of the substrate transport device before transport of substrates is started. First, substrates are put on the susceptors by the robot arm 24 in the WHC (vacuum chamber 22). For example, the robot arm 24 puts substrates 36 and 37 on the two susceptors 30a and 30b at the vacuum chamber 22 side. It is assumed that substrates 38 and 39 which have already been processed are on the susceptors 30c and 30d.

In a state where all the susceptors have the substrates put thereon as described above, all the substrates are lifted with the susceptor pins 30p. The rotation arms 50A, 50B, 50C, and 50D are rotated in the direction of an arrow by rotation of the shaft 50E and are stopped when the contact rotation arms reach the pick positions (the positions indicated by the dot-dash line). FIG. 5 shows a state where the rotation arms 50B and 50D, i.e., the contact rotation arms, are at the pick positions. At this time, all the rotation arms are positioned between the susceptors and the substrates. Therefore, great parts of the rotation arms 50A, 50B, 50C, and 50D are hidden under the substrates 36, 37, 38, and 39, as viewed in plan.

Figure 6:
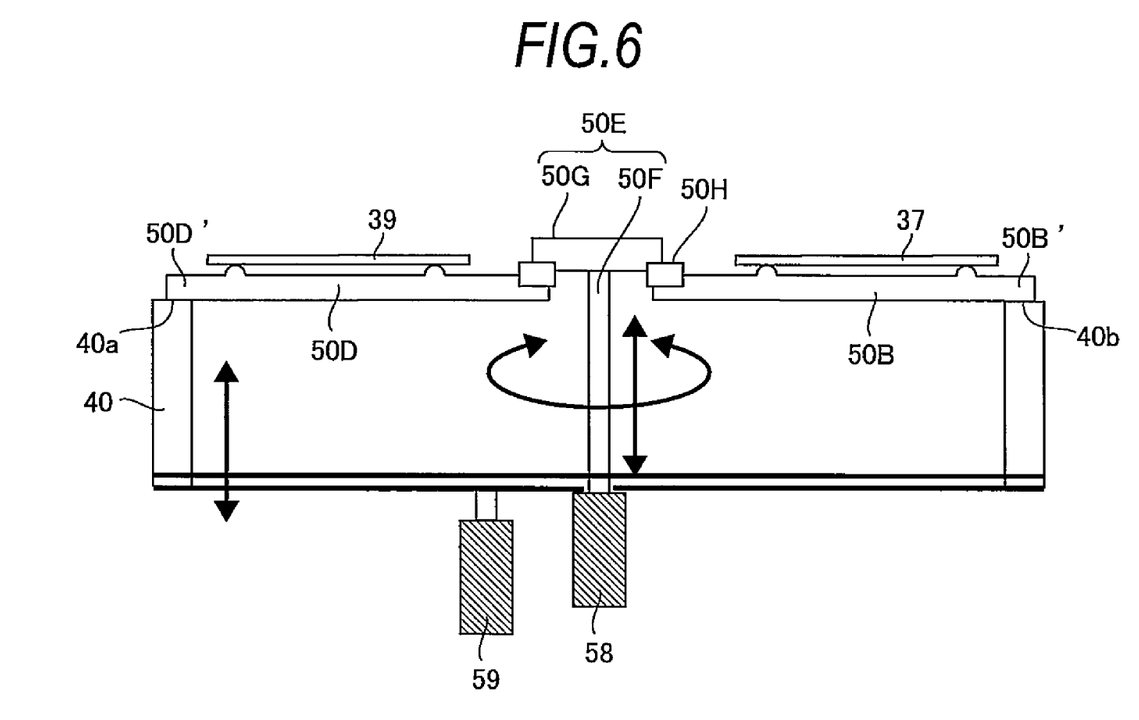
FIG. 6 is a sectional view of the substrate transport device.

In this state, the shaft 50E and the cylindrical supporting part 40 are moved upward. FIG. 6 is a sectional view of the substrate transport device showing a state after the shaft and the cylindrical supporting part are moved upward. The shaft 50E has a support column 50F and a ceiling plate 50G attached to the top of the support column 50F. A first moving part 58 for moving the shaft 50E in the vertical direction and in the rotational direction is attached to the shaft 50E. A second moving part 59 for moving the cylindrical supporting part 40 in the vertical direction is attached to the cylindrical supporting part 40. The second moving part 59 elevates or lower the bottom of the chamber in order to move the cylindrical supporting part 40 in the vertical direction. Each of the first moving part 58 and the second moving part 59 has, for example, a motor. It is preferable that vertical motions of the shaft 50E and the cylindrical supporting part 40 be synchronized with each other. Naturally, first moving part 58 and second moving part 59 may be merged into one moving part. In such case, one moving part moves shaft 50E and the cylindrical supporting part 40.

The contact rotation arms 50B and 50D are connected to the shaft 50E by hinges 50H, as shown in FIG. 6. The non-contact rotation arms are also connected to the shaft 50E by hinges. Therefore, all the rotation arms can be inclined with respect to the horizontal.

The shaft 50E and the cylindrical supporting part 40 are moved upward by the first moving part 58 and the second moving part 59. The amounts of movement of the shaft 50E and the cylindrical supporting part 40 are made equal to each other. During and after the movement, the contact between the contact rotation arms 50B and 50D and the upper surface of the cylindrical supporting part 40 is maintained. By this movement, the substrates are moved apart from the susceptor pins to enter a state of being supported by the rotation arms. FIG. 6 shows a state where projections of the contact rotation arms 50B and 50D abut against the substrates 37 and 39 to support the substrates 37 and 39.

The contact rotation arm 50B contacts the first upper surface 40b, while the contact rotation arm 50D contacts the first upper surface 40a. When the contact rotation arms 50B and 50D are at the pick positions, all the rotation arms are generally horizontal and the substrates do not slide on the rotation arms.

Figure 7:
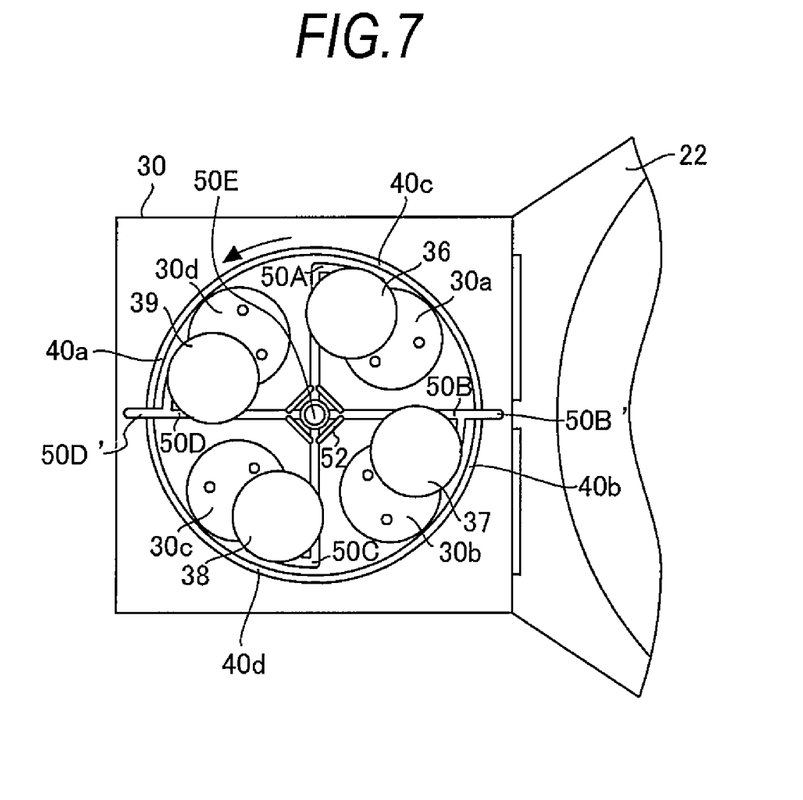
FIG. 7 is a plan view of the substrate transport device.

Subsequently, the rotation anus supporting the substrates are rotated. More specifically, the first moving part 58 is driven to rotate the rotation arms 50A, 50B, 50C, and 50D in the direction of the arrow in FIG. 7. FIG. 7 is a plan view showing internal portions of the substrate transport device during rotation. During rotation of the rotation arms, the contact rotation arms 50B and 50D slide on the upper surface of the cylindrical supporting part 40. The contact rotation arm 50D starts from the first upper surface 40a and comes to the first upper surface 40b via the second upper surface 40d. The contact rotation arm 50B starts from the first upper surface 40b and comes to the first upper surface 40a via the second upper surface 40c. In short, with this rotation, each contact rotation arm moves from one of the pick positions to the other of the pick positions, as viewed in plan. That is, each rotation arm is rotated through 180°. For example, referring to FIG. 3, each contact rotation arm moves from one of the pick positions to the other of the pick positions along the upper surface of the cylindrical supporting part 40.

The first moving part 58 rotates the shaft 50E by means of s-curve control. Accordingly, when the rotational speed of the shaft 50E is maximum, the rotation arms 50B and 50D are at the highest positions on the second upper surfaces 40c and 40d. For example, the contact rotation arm 50B is at the position on the second upper surface 40c shown in FIG. 3, and the contact rotation arm 50D is at the position on the second upper surface 40d shown in FIG. 3. When the contact rotation arms are at the highest positions on the second upper surfaces 40c and 40d, the inclinations of the contact rotation arms 50B and 50D is maximized. Since the angle of inclination of the contact rotation arms 50B and 50D and the angle of inclination of the non-contact rotation arms 50A and 50C generally coincide with each other, the inclinations of the non-contact rotation arms 50A and 50C are also maximized when the inclinations of the contact rotation arms 50B and 50D are maximized. When the rotational speed of the shaft 50E is maximized, the inclination of each rotation arm is therefore maximized.

Figure 8:
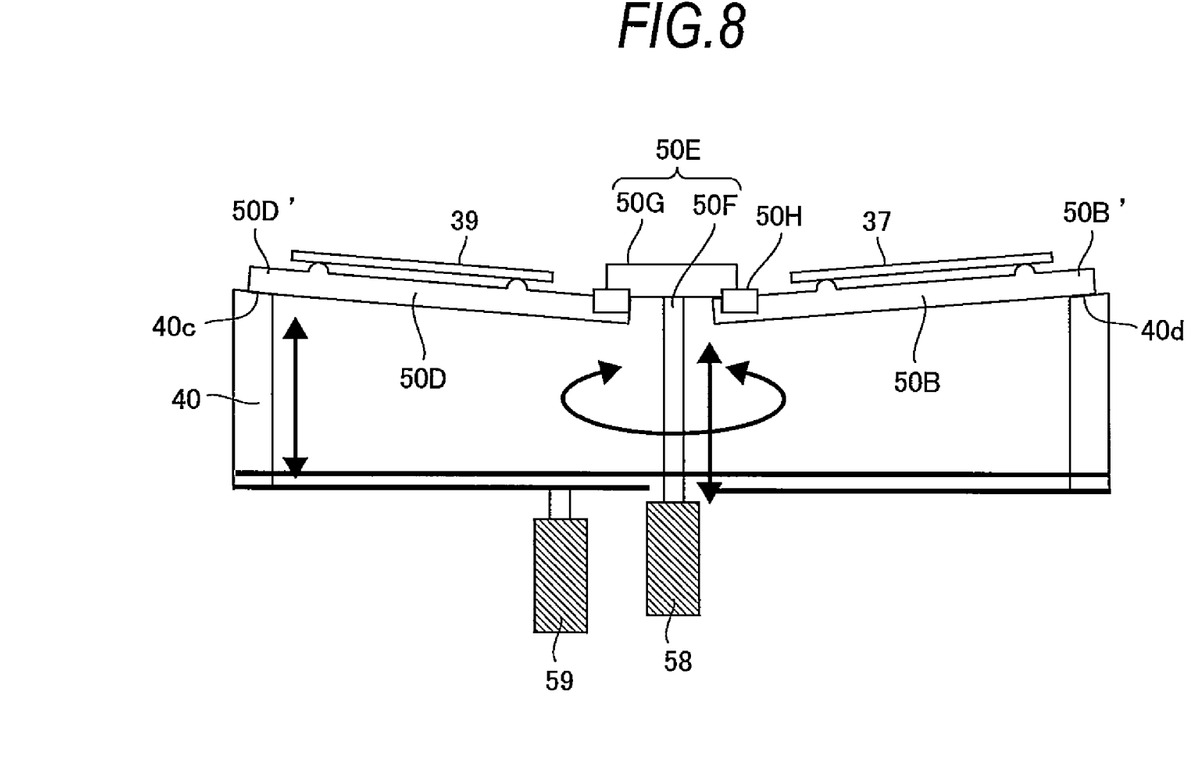
FIG. 8 is a sectional view of the substrate transport device.

FIG. 8 is a sectional view of the substrate transport device showing inclination of the rotation arms during rotation of the shaft. Since all the rotation arms are connected to the shaft 50E by hinges 50H, they are inclined in such a mode as to be increased in height at the positions opposite to the shaft 50E. When the rotational speed of the shaft 50E is maximized, centrifugal force acts on the substrates 37 and 39 (also on other substrates) and there is a risk of the substrates being thereby caused to slide on the arms in such directions as to move away from the shaft. In the first embodiment of the present invention, the heights of portions of the rotation arms distant from the shaft 50E are therefore increased by inclining the rotation arms when the rotational speed of the shaft 50E is maximized, thereby preventing the above-described sliding. Needless to say, the rotation arms are inclined to such a degree that the substrate does not slide toward the shaft 50E.

The contact rotation arm starting from the pick position shown in FIG. 3 (the first upper surface 40a) enters a deceleration stage when passing through a point corresponding to the maximum rotational speed (the position corresponding to the maximum of the height of the second upper surface 40d). The rotational speed of the shaft 50E continues decreasing and becomes zero when the contact rotation arm reaches the pick position (the first upper surface 40b). When the rotational speed of the shaft 50E becomes zero, the contact rotation arm is at the position (pick position) corresponding to the minimum of the height of the upper surface of the cylindrical supporting part 40 and therefore all the rotation arms are generally horizontal. Thus, the contact rotation arms are generally horizontal when in contact with the first upper surfaces 40a and 40b and are inclined in such a manner as to be higher at a position more distant from the shaft when in contact with the second upper surfaces 40c and 40d.

Subsequently, the substrates are returned onto the susceptors. In this step, the shaft 50E and the cylindrical supporting part 40 are moved downward by the first moving part 58 and the second moving part 59, with the susceptor pins 30p projecting above the susceptors. The substrates 38, 39, 36, and 37 are thereby put on the susceptor pins of the susceptors 30a, 30b, 30c, and 30d and moved apart from the rotation arms. The shaft 50E is then slightly returned counterclockwise so that the rotation arms are not located right below the substrates. After the completion of the transport of the substrates thus performed, the processed substrates 38 and 39 are taken out of the QCM 30 by the robot arm 24 and new substrates are supplied onto the susceptors 30a and 30b.

Thereafter, processing on the substrates is executed by the QCM 30. The substrate transport conditions can be changed if necessary according to a substrate processing schedule.

When rotational speed of the shaft 50E is maximum or substantially high, the contact rotation arms 50B and 50D are on the second upper surfaces 40c and 40d and therefore all the rotation arms are inclined to inhibit sliding of the substrates. On the other hand, when rotational speed of the shaft 50E is zero or substantially low, the contact rotation arms 50B and 50D are on the first upper surfaces 40a and 40b and therefore the inclination of each rotation arm is limited to inhibit sliding of the substrate. Also, the rotation arms are moved in the vertical direction at the pick positions to maintain the rotation arms in a generally horizontal state, thereby preventing sliding of the substrates. The substrates can thus be prevented from moving on the arms during transport of the substrates and before and after the transport.

The first upper surfaces 40a and 40b are generally horizontal surfaces, as shown in FIG. 6, while the second upper surfaces 40c and 40d are surfaces sloped so as to lower from the outer peripheral side to the inner peripheral side, as shown in FIG. 8. When the contact rotation arms run on the first upper surfaces 40a and 40b, the contact rotation arms are generally horizontal and therefore contact the generally horizontal first upper surfaces 40a and 40b in a surface-contact manner. When the contact rotation arms run on the second upper surfaces 40c and 40d, the contact rotation arms are inclined and therefore contact the sloped second upper surfaces 40c and 40d in a surface-contact manner. The contact rotation arms and the cylindrical supporting part 40 can thus be prevented from contacting each other in a point-contact manner and generating dust as a result of friction therebetween.

In the first embodiment of the present invention, the cylindrical supporting part 40, the shaft 50E, the rotation arms 50A, 50B, 50C, and 50D, the first moving part 58 and the second moving part 59 provided with the QCM 30 constitute the substrate transport device. The substrate transport device according to the present invention, however, can take a different form. The substrate transport device according to the present invention is essentially a device having rotation arms inclined so as to cancel out centrifugal force acting on substrates during rotation to a shaft to prevent the substrates from moving on the arms during transport of the substrates. Various modifications of the device can be made within such a scope that this feature is not lost.

For example, the number of rotation arms and the shapes of the rotation arms may be changed. At least one rotation arm may be attached to the shaft 50E. However, at least one contact rotation arm is necessary. Limiting of the movements of substrates is enabled by suitably changing the shape of the cylindrical cover according to the number of rotation arms. In the first embodiment, the substrate transport device is provided with the QCMs (four chambers in which the same processing is performed). In other words, a series of film forming processes is conducted in each of the four chambers. After finishing the film forming processes, substrates withdrawal toward WHC will take place. However, the above-described substrate transport device may be provided with an apparatus having chambers in which different kinds of processing are performed.

That is, it is possible to make use of the substrate transport device of the present invention with an apparatus other than the QCMs. For example, the substrate transport device of the present invention may be incorporated in a substrate processing apparatus having a plurality of process regions. The plurality of process regions may be accommodated in a large chamber. In this case, the substrate transport device moves a substrate between the plurality of process regions. Same processing or different kinds of processing may be performed in the plurality of process regions.

For another example, the substrate transport device of the present invention may be incorporated in a substrate processing apparatus having a plurality of chambers. QCMs is one embodiment of the plurality of chambers. In this case, the substrate transport device moves a substrate between the plurality of chambers. Same processing or different kinds of processing may be performed in the plurality of chambers.

The number of susceptors surrounded by the cylindrical supporting part 40 is not particularly limited.

If the contact rotation arms are in some places on the second upper surfaces 40c and 40d when the rotational speed of the shaft E is maximum in s-curve control, the rotation arms are inclined. In the strict sense, therefore, it is not necessary that the contact rotation arms be in the highest places on the cylindrical supporting part 40 when the rotational speed of the shaft 50E is maximum.

Inhibiting sliding of substrates requires that the contact rotation arms be generally horizontal when the rotational speed of the shaft 50E is zero. If the first upper surfaces 40a and 40b are formed as generally flat surfaces, the rotation arms can be made generally horizontal by positioning the rotation arms on the first upper surfaces when the rotational speed of the shaft 50E is zero. In the strict sense, it is not necessary that the contact rotation arms when the rotational speed of the shaft is zero be in contact with the lowest positions on the first upper surfaces. Also, the cylindrical supporting part 40 is capable of adjusting the height of the rotating rotation arms if it has an upper surface waved as seen in front view. Therefore, it is not necessary that the cylindrical supporting part be "cylindrical". Any supporting part providing a waved upper surface may suffice.

These modifications can be applied as desired to substrate transport devices and substrate processing apparatus according to embodiments described below. The substrate transport devices and substrate processing apparatus according to the embodiments described below have a number of commonalities with the first embodiment and will therefore be described mainly with respect to points of difference from the first embodiment.

Second Embodiment

Figure 9:
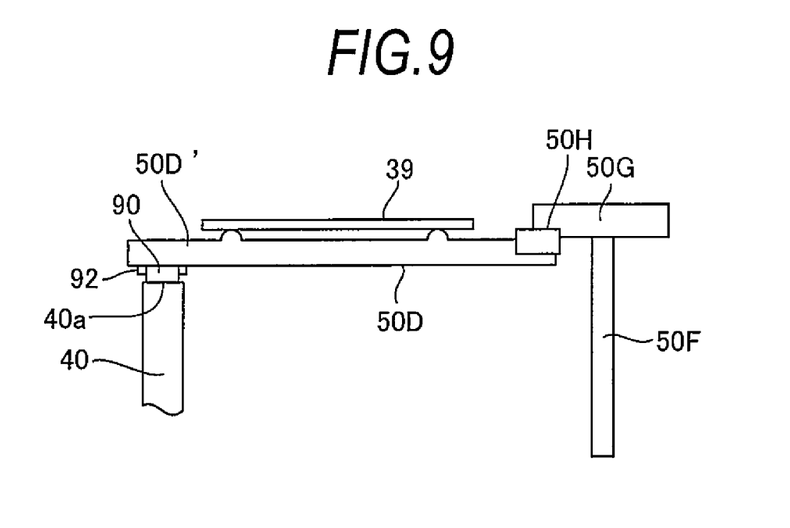
FIG. 9 is a sectional view of a portion of the substrate transport device according to the second embodiment.

FIG. 9 is a sectional view of a portion of the substrate transport device according to the second embodiment. A wheel 90 is attached to a lower side of a rotation arm 50D. The wheel 90 is fixed to the rotation arm 50D by a shaft part 92 passing through a center of the wheel 90. The rotation arm 50D contacts the upper surface of the cylindrical supporting part 40 by means of the wheel 90. With rotation of the rotation arm, the wheel 90 slides on the upper surface of the cylindrical supporting part 40.

Figure 10:
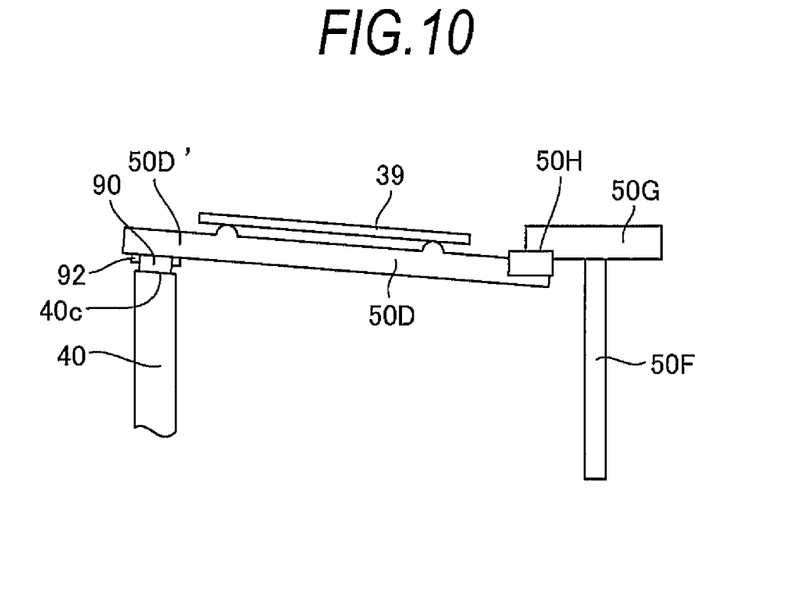
FIG. 10 is a sectional view of a portion of the substrate transport device.
Figure 11:
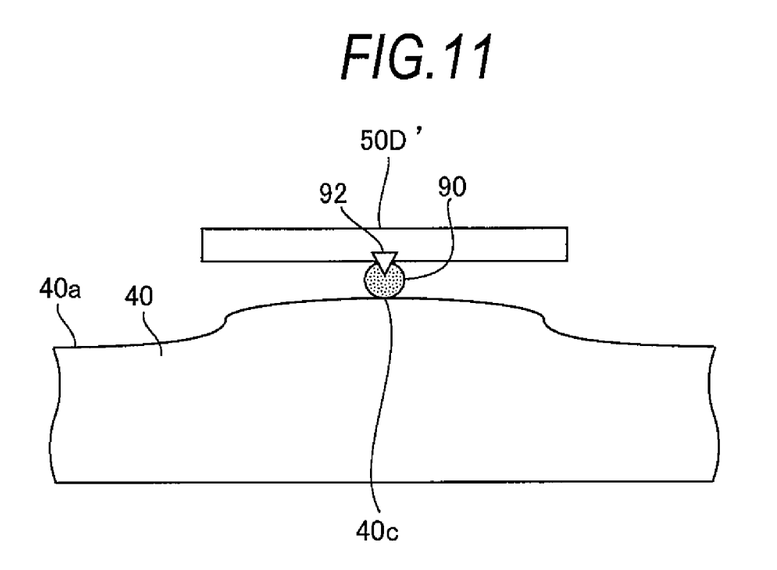
FIG. 11 is a side view of the wheel.

FIG. 9 shows a state where the wheel 90 and the first upper surface 40a contact each other. FIG. 10 shows a state where the wheel 90 and the second upper surface 40c contact each other. FIG. 11 is a side view of the wheel 90. The wheel 90 runs on the sloped upper surface of the cylindrical supporting part 40. The provision of the wheel 90 enables reducing friction in comparison with the case where the rotation arm and the cylindrical supporting part 40 directly contact each other, thus limiting the generation of particles. It is desirable to attach wheels to all contact rotation arms.

Third Embodiment

Figure 12:
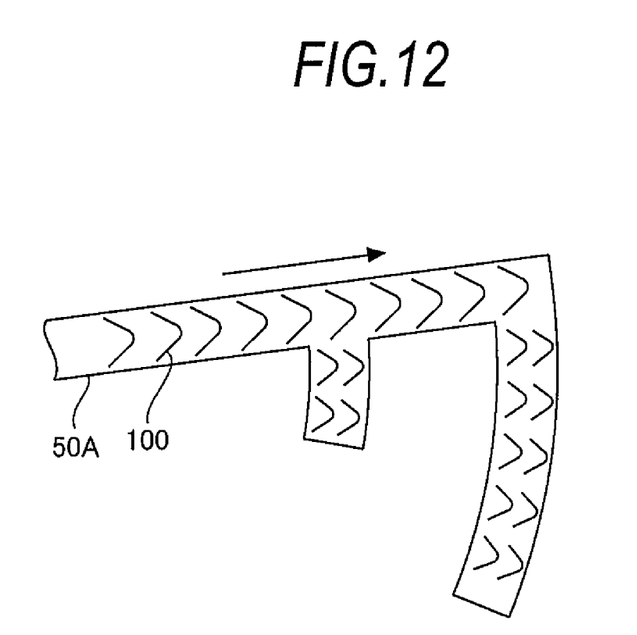
FIG. 12 is a plan view of a rotation arm according to the third embodiment.

FIG. 12 is a plan view of a rotation arm 50A according to the third embodiment. Projections 100 which are convex in the direction of being away from the shaft (the direction of an arrow) as viewed in plan are formed on an upper surface of the rotation arm 50A. The projections 100 contact a substrate.

The projections 100 are provided for the purpose of preventing the substrate from moving toward the shaft when the rotation arm is inclined. Since the projections 100 have the shape convex in the direction of centrifugal force of the substrate as viewed in plan, the projections 100 are effective in preventing the substrate from sliding toward the shaft. It is preferable that the projections 100 thus formed be provided on all rotation arms. A suitable combination of the features of the substrate transport devices and the substrate processing apparatuses according to the embodiments described above may be made and used as desired.

According to the present invention, the arm is inclined so as to cancel out centrifugal force when the centrifugal force acts on the substrate, thus preventing the substrate from moving on the arm during transport of the substrate.

Obviously many modifications and variations of the present invention are possible in the light of the above teachings. It is therefore to be understood that within the scope of the appended claims the invention may be practiced otherwise than as specifically described.

What is claimed is:

1. A substrate transport device comprising:
   a shaft;
   a first moving part for moving the shaft in a vertical direction and in a rotational direction;
   at least one rotation arm attached to the shaft; and
   a supporting part surrounding the shaft in plan view and having a wave-shaped upper surface as seen from a front view,
   wherein
   the at least one rotation arm includes a contact rotation arm which directly or indirectly contacts the upper surface of the supporting part, and
   the at least one rotation arm extends lengthwise from the shaft toward the supporting part in a direction radial to the shaft.

2. The substrate transport device according to claim 1, wherein the upper surface of the supporting part includes a first upper surface including a portion lowest in height, and a second upper surface including a portion highest in height, and
   wherein the contact rotation arm is generally horizontal when in contact with the first upper surface and is inclined so as to be higher at a position more distant from the shaft when in contact with the second upper surface.

3. The substrate transport device according to claim 2, wherein the first upper surface is a generally horizontal surface, and the second upper surface is a surface sloped so as to lower from the outer peripheral side to the inner peripheral side.

4. The substrate transport device according to claim 2, wherein the first moving part rotates the shaft by means of s-curve control,
   the contact rotation arm is on the second upper surface when a rotational speed of the shaft is maximum, and
   the contact rotation arm is on the first upper surface when the rotational speed of the shaft is zero.

5. The substrate transport device according to claim 4, wherein inclination of the at least one rotation arm is maximum when the rotational speed of the shaft is maximum, and
   wherein the at least one rotation arm is generally horizontal when the rotational speed of the shaft is zero.

6. The substrate transport device according to claim 1, comprising a hinge which connects the contact rotation arm and the shaft to each other.

7. The substrate transport device according to claim 1, comprising a plurality of the rotation arms; and
   a sync unit to which the plurality of rotation arms are connected, wherein when the angle of inclination of one of the rotation arms is increased, the sync unit increases the angles of inclination of other rotation arms, and when the angle of inclination of one of the rotation arms is reduced, the sync unit reduces the angles of inclination of other rotation arms.

8. The substrate transport device according to claim 7, wherein the plurality of rotation arms include a non-contact rotation arm which is shorter than the contact rotation arm, and which does not contact the supporting part.

9. The substrate transport device according to claim 1, comprising a second moving part for vertically moving the supporting part.

10. The substrate transport device according to claim 1, comprising a wheel attached to a lower side of the at least one rotation arm,
    wherein the at least one rotation arm contacts the upper surface of the supporting part by means of the wheel.

11. The substrate transport device according to claim 1, wherein a projection which is convex in a direction of being away from the shaft as viewed in plan is formed on an upper surface of the at least one rotation arm.

12. A substrate processing apparatus comprising:
    a substrate transport device having a shaft, a first moving part for moving the shaft in a vertical direction and in a rotational direction, at least one rotation arm attached to the shaft, and a supporting part surrounding the shaft in plan view and having a wave-shaped upper surface as seen from a front view, wherein the at least one rotation arm includes a contact rotation arm which directly or indirectly contacts the upper surface of the supporting part; and
    a plurality of process regions,
    wherein the substrate transport device moves a substrate between the plurality of process regions, and
    the at least one rotation arm extends lengthwise from the shaft toward the supporting part in a direction radial to the shaft.

13. The substrate processing apparatus according to claim 12, wherein same processing is performed in the plurality of process regions.

14. The substrate processing apparatus according to claim 12, wherein different kinds of processing are performed in the plurality of process regions.

15. A substrate processing apparatus comprising:
    a substrate transport device having a shaft, a first moving part for moving the shaft in a vertical direction and in a rotational direction, at least one rotation arm attached to the shaft, and a supporting part surrounding the shaft in plan view and having a wave-shaped upper surface as seen from a front view, wherein the at least one rotation arm includes a contact rotation arm which directly or indirectly contacts the upper surface of the supporting part; and
    a plurality of chambers,
    wherein the substrate transport device moves a substrate between the plurality of chambers, and the at least one rotation arm extends lengthwise from the shaft toward the supporting part in a direction radial to the shaft.

16. The substrate processing apparatus according to claim 15, wherein same processing is performed in the plurality of chambers.

17. The substrate processing apparatus according to claim 15, wherein different kinds of processing are performed in the plurality of chambers.

* * * * *